(12) United States Patent
Bommu et al.

(10) Patent No.: US 6,223,316 B1
(45) Date of Patent: Apr. 24, 2001

(54) VECTOR RESTORATION USING ACCELERATED VALIDATION AND REFINEMENT

(75) Inventors: Surendra K. Bommu, Plainsboro; Srimat T. Chakradhar, Old Bridge; Kiran B. Doreswamy, Plainsboro, all of NJ (US)

(73) Assignee: NEC USA, Inc., Princeton, NJ (US)

( * ) Notice: Subject to any disclaimer, the term of this patent is extended or adjusted under 35 U.S.C. 154(b) by 0 days.

(21) Appl. No.: 09/112,945

(22) Filed: Jul. 10, 1998

Related U.S. Application Data

(60) Provisional application No. 60/086,758, filed on May 27, 1998.

(51) Int. Cl.[7] ..................................................... G06F 11/00
(52) U.S. Cl. ........................................... 714/738; 714/735
(58) Field of Search ................................. 714/738, 739, 714/724, 735

(56) References Cited

U.S. PATENT DOCUMENTS

| | | | |
|---|---|---|---|
| 5,485,471 | * 1/1996 | Bershteyn | 714/739 |
| 5,555,270 | * 9/1996 | Sun et al. | 714/738 |
| 5,726,996 | * 3/1998 | Chakradhar et al. | 714/724 |
| 5,796,752 | * 8/1998 | Sun et al. | 714/738 |
| 5,983,381 | * 11/1999 | Chakradhar et al. | 714/738 |

\* cited by examiner

*Primary Examiner*—Albert Decady
*Assistant Examiner*—David Ton
(74) *Attorney, Agent, or Firm*—Sughrue, Mion, Zinn, Macpeak & Seas, PLLC

(57) ABSTRACT

A two phase vector restoration technique which extracts a minimal subsequence from a sequence that detects a chosen set of faults is provided. The disclosed vector restoration technique is useful in static compaction of test sequences and in fault diagnosis. An accelerated two phase vector restoration that provides further improvement is also provided. The present invention is a significant improvement over the state of the art in the following ways: (1) a sequence of length n can be restored with only $O(n \log_2 n)$ simulations while known approaches require simulation of $O(n^2)$ vectors, (2) a two-step restoration process is used that makes vector restoration practical for large designs, and (3) restoration process for several faults is overlapped to provide significant acceleration in vector restoration. The described vector restoration technique has been integrated into a static test sequence compaction system.

16 Claims, 17 Drawing Sheets

```
Algorithm 2φ(F_U, D)
    F_U : Input fault list
    D : Detection times for all faults
{
1.  ResSeq = Nil ;
2.  while (F_U ≠ Nil) {
3.      F_T = {f | f ∈ F_U & D[f] is highest} ;
4.      base = MINIMUM(D[f], FIRST(ResSeq));
            —— VALIDATION PHASE ——
5.      low = base ; i = 0;
6.      while (F_T not detected) {
7.          Seq = {v_low,...,v_base} ∪ ResSeq ;
8.          FAULTSIMULATE (Seq, F_T) ;
9.          if (F_T not detected) {
10.             high = low ;
11.             low = base - 2^i ; i++;
12.         }
13.     }
14.     MARK_FAULTS_UNDETECTED (F_T) ;
            —— REFINEMENT PHASE ——
15.     while (low < high - 1) {
16.         opt = ⌊(low+high)/2⌋ ;
17.         Seq = {v_opt,...,v_base} ∪ ResSeq ;
18.         FAULTSIMULATE (Seq, F_T) ;
19.         if(F_T is detected) {
20.             low = opt ;
21.             MARK_FAULTS_UNDETECTED(F_T) ;
22.         } else {
23.             high = opt ;
24.         }
25.     }
26.     MARK_FAULTS_DETECTED(F_T) ;
27.     F_U = F_U - F_T ;
28.     ResSeq = {v_low,...,v_base} ∪ ResSeq ;
29. }
30. return (ResSeq) ;
}
```

FIG. 4

```
Algorithm 2ϕ*(F_u, D)
    F_u : Input fault list
    D : Detection times for all faults
{
1.  ResSeq = Nil ;
2.  base = MAXIMUM_{f∈F_u} (D[f]);
3.  F_T = {f | f ∈ F_u & D[f] + base} ;
4.  RESET_LOW_HIGH (F_u, base+1);
5.  while (F_u ≠ Nil) {
6.      OVERLAPPED_VALIDATION (F_u, F_T, ResSeq, base);
7.      if (SEGMENT_FOUND(F_u, F_T, ResSeq, base)) {
8.          opt = OVERLAPPED_REFINEMENT (F_u, F_T, ResSeq, base) ;
9.          ResSeq = {υ_opt,..., υ_base} ∪ ResSeq :
10.         base = MAXIMUM_{f∈F_u} (D[f] = base ) ;
11.         F_T = {f | f ∈ F_u & D[ f] = base} ;
12.         RESET_LOW_HIGH (F_u, base+1);
13.     }
14. }
15. return(ResSeq) ;
}
```

FIG. 7

Algorithm OVERLAPPED_VALIDATION($F_u$, $F_T$, ResSeq,base)
    $F_u$: Undetected fault list
    $F_T$: Current target fault list
    ResSeq: Set of Vectors restored for previous targets
    base: Restoration for $F_T$ begins from vector $v_{base}$
{
1.  $i = low = 0$;
2.  $start = \text{MINIMUM}_{f \in F_T}(HIGH[f])$ ;
3.  while ($F_T$ not detected) {
4.     $low = \text{MAXIMUM}(start - 2^i, low)$ ; $i++$ ;
5.     $Seq = \{v_{low},...,v_{base}\} \cup ResSeq$;
6.     $F_S = \{f | f \in F_u \& D[f] \geq low \& HIGH[f] > low\}$ ;
7.     FAULT_SIMULATE ($Seq, F_S$) ;
8.     UPDATE_LOW_HIGH ($F_S, low$) ;
9.     UPDATE_TARGETS ($F_T, F_u$) ;
10. }
11. return ;
}

FIG. 9

```
Algorithm UPDATE_LOW_HIGH(F, index)
    F: fault list being updated
    index: index of first vector in sequence used for fault simulation {
1. foreach (f ∈ F) {
2.     if (f is detected) {
3.         LOW[f] = MAXIMUM(LOW[f], index) ;
4.     } else {
5.         HIGH[f] = MINIMUM(HIGH[f], index) ;
6.     }
7. }
8. return;
}
```

FIG. 10

```
Algorithm UPDATE_TARGETS($F_T$, $F_u$)
    $F_T$ : current target fault list
    $F_u$ : current set of undetected fault list
{
1.  do {
2.      Target_Changed = False;
3.      $f_p$ = {$f$ | $f \in F_u - F_T$, $D[f]$ is highest} ;
4.      high = MINIMUM$_{f \in F_T}$ (HIGH[$f$]) ;
6.      if (high ≤ $D[f_p]$ +1 HIGH[$f_p$] ≤ $D[f_p]$) {
7.          $F_T = F_T \cup f_p$ ;
8.          Target_Changed = True ;
9.      }
10.     $F_{det}$ = {$f$ | $f \in F_T$, LOW[$f$] ≥ high} ;
11.     $F_T = F_T - F_{det}$ ;
12.     $F_u = F_u - F_{det}$ ;
13.     MARK_FAULTS_DETECTED($F_{det}$) ;
14. } while( Target_Changed == True)
15. return;
}
```

FIG. 11

```
Algorithm SEGMENT_FOUND(Fu, F_T, ResSeq, base)
    Fu : current undetected fault list
    FT : current target fault list
    ResSeq: sequence restored for previous targets
    base: last vector of new segment (if any) is vector $v_{base}$
{
1.  status = Uncertain;
2.  low = MINIMUM$_{f \in F_T}$(LOW[f]) ;
3.  while (status == Uncertain) {
4.      $F_C$ = {f | f ∈ $F_U$ & D[f] ≥ low & HIGH[f] ≤ low};
5.      if ($F_C$ == Nil) {
6.          status = Segment_found;
7.      } else {
8.          low = 1 + MAXIMUM$_{f \in F_C}$(D[f]) ;
9.          Seq = {$v_{low}$, ..., $v_{base}$} ResSeq ;
10.         $F_S$ = {f | f ∈ $F_U$ & D[f] ≥ low & HIGH[f] > low} ;
11.         FAULT_SIMULATE (Seq, $F_S$) ;
12.         UPDATE_LOW_HIGH ($F_S$, low) ;
13.         if ($F_T$ is detected) {
14.             MARK_FAULTS_UNDETECTED ($F_S$) ;
15.         } else {
16.             UPDATE_TARGETS ($F_T$, $F_U$) ;
17.             status = No_segment ;
18.         }
19.     }
20. }
21. return(status) ;
}
```

FIG. 12

Algorithm OVERLAPPED_REFINEMENT($F_u$, $F_T$, ResSeq, base)
    $F_u$: current undetected fault list
    $F_T$: current target fault list
    ResSeq: restored sequence for previous targets
    base: last vector of new segment is $v_{base}$
{
1.  high = MINIMUM$_{f \in F_T}$ (HIGH[$f$]) ;
2.  low = MINIMUM$_{f \in F_T}$ (LOW[$f$]) ;
3.  binary_search = Yes ;
4.  while (low < high - 1) {
5.    opt = (binary_search == Yes) ? $\frac{low + high}{2}$ : start ;
6.    Seq = {$v_{opt}$,..., $v_{base}$}$\cup$ResSeq ;
7.    $F_S$ = {$f | f \in F_u$ & $D[f] \geq opt$ & $HIGH[f] \leq opt$} ;
8.    FAULT_SIMULATE (Seq, $F_S$) ;
9.    UPDATE_LOW_HIGH ($F_S$, opt) ;
10.   if ($F_T$ is detected) {
11.     $F_C$ = {$f | f \in F_u$ & $D[f] \geq opt$ & $HIGH[f] \leq opt$} ;
12.     start = 1 + MAXIMUM$_{f \in F_C}$ ($D[f]$) ;
13.     MARK_FAULTS_UNDETECTED($F_S$) ;
14.     low = opt ;
15.     binary_search = ($F_C$ == Nil) ? Yes : No ;
16.   } else {
17.     UPDATE_TARGETS ($F_T$, $F_u$);
18.     high = MINIMUM$_{f \in F_T}$ (HIGH[$f$]) ;
19.     low = MINIMUM$_{f \in F_T}$ (LOW[$f$]) ;
20.     binary_search = Yes ;
21.   }
22. }
23. return;
}

FIG. 14

INITIAL STIMULATION $f_1$ $f_2$ $f_3$ $f_4$ $f_5$ $f_6$ $f_7$ $f_8$ 1  14  18 19  21 22  26  29 30

$D[f_1] = 14$; $D[f_2] = 18$
$D[f_3] = 19$; $D[f_4] = 21$
$D[f_5] = 22$; $D[f_6] = 26$
$D[f_7] = 29$; $D[f_8] = 30$

SEQUENCES DETECTING THE FAULT FROM ALL UNKNOWN STATES

| FAULT | |
|---|---|
| $f_1$ | 3 → 14 |
| $f_2$ | 17 → 18 |
| $f_3$ | 16 → 19 |
| $f_4$ | 19 → 21 |
| $f_5$ | 1 → 22 OR 22 → 28 |
| $f_6$ | 21 → 26 |
| $f_7$ | 21 → 29 |
| $f_8$ | 29 → 30 |

FIG. 15

TABLE 1: COMPACTION RESULTS FOR ISCAS CIRCUITS USING HITEC TEST SETS

| CKT | VECTORS | | | INITIAL SIM. TIME | CPU SECONDS | |
|---|---|---|---|---|---|---|
| | ORIGINAL | COMPACTED | % R | | LVR* | 2φ* |
| s298 | 322 | 216 | 32 | 0.3s | 1.1s | 0.8s |
| s344 | 127 | 61 | 51 | 0.2s | 0.3s | 0.3s |
| s382 | 2074 | 878 | 78 | 4.6s | 52.4s | 6.0s |
| s444 | 2240 | 1005 | 55 | 5.5s | 16.0s | 7.5s |
| s526 | 2258 | 1526 | 32 | 6.8s | 82.5s | 12.0s |
| s641 | 209 | 125 | 40 | 0.4s | 0.7s | 0.8s |
| s713 | 173 | 106 | 38 | 0.4s | 0.7s | 0.8s |
| s820 | 1115 | 790 | 29 | 2.1s | 5.4s | 5.9s |
| s832 | 1137 | 779 | 31 | 2.2s | 6.9s | 6.5s |
| s1196 | 435 | 281 | 35 | 1.1s | 2.2s | 2.2s |
| s1238 | 475 | 303 | 36 | 1.3s | 2.5s | 2.7s |
| s1423 | 150 | 134 | 10 | 2.2s | 8.2s | 4.2s |
| s1488 | 1170 | 828 | 29 | 4.4s | 11.8s | 10s |
| s1494 | 1245 | 855 | 31 | 4.7s | 12.8s | 11s |
| s5378 | 912 | 653 | 28 | 22.1s | 91s | 39s |
| s35932 | 496 | 202 | 59 | 198s | 619s | 487s |

VEC: TEST SET LENGTH    TIME: EXECUTION TIME
% R: PERCENT REDUCTION FROM ORIGINAL TEST SET SIZE

FIG. 16

TABLE 2: COMPACTION RESULTS FOR PRODUCTION CIRCUITS

| CKT | GATES | FFs | VECTORS | | | INITIAL SIM. TIME | CPU SECONDS | | |
|---|---|---|---|---|---|---|---|---|---|
| | | | ORIG. | COMP. | %R | | LVR* | 2-φ | 2-φ* |
| p7A | 7784 | 137 | 1702 | 989 | 41 | 98 s | 606 s | 199 | 185 s |
| p7B | 6687 | 130 | 2267 | 1650 | 27 | 95 s | 390 s | 188 | 179 s |
| p12 | 8489 | 408 | 3510 | 2505 | 33 | 347 s | 2019 | 635 | 589 s |
| p20 | 12145 | 487 | 2318 | 1894 | 18 | 301 s | 4238 | 1966 | 877 s |
| p30 | 24824 | 995 | 1836 | 3192 | 37 | 186 s | 2350 | 1203 | 974 s |
| p29 | 62617 | 935 | 9366 | 7201 | 23 | 2097 s | 41616 | 13997 | 12380 s |
| p306 | 223962 | 5005 | 3499 | 3399 | 2 | 3520 s | NA | 69829 | 31968 s |

GATES: NUMBER OF GATES   FFs: NUMBER OF FLIP-FLOPS
VEC: TEST SET LENGTH
% R: PERCENT REDUCTION FROM ORIGINAL TEST SET SIZE

FIG. 17

VECTOR RESTORATION USING ACCELERATED VALIDATION AND REFINEMENT

This application claims priority from co-pending U.S. Provisional Patent Application Ser. No. 60/086,758 filed on May 27, 1998.

I. DESCRIPTION OF THE INVENTION

IA. Field of the Invention

This invention relates to a method for restoring test vectors that are used to detect faults in large industrial design systems. Specifically, this invention relates to a method for restoring a minimal subsequence of vectors that detects a chosen set of faults. This invention is embodied in a method for two-step vector restoration and a method for accelerated two-step vector restoration that improve run-times of fault diagnosis for large designs.

IB. Background of the Invention

A vector is a set of inputs to a system. A test set is a set of vectors that identify faults in the system. Target fault list is a list of a subset of faults that are identified by a given test set. Given a test set, and a set of target fault list that is known to be detected by the test set, vector restoration techniques identify a minimal subsequence that detects all faults in the target fault list. See R. Guo, I. Pomeranz, and S. M. Reddy, "Procedures for static compaction of test sequences for synchronous sequential circuits based on vector restoration," *Technical Report* 8.3.1997, Electrical and Computer Engineering Department, University of Iowa, 1997.

Restoration techniques are useful in static test sequence compaction or fault diagnosis methods. Known static test sequence compaction methods are described in the following references: T. M. Niermann, R. K. Roy, J. H. Patel, and J. A. Abraham, "Test compaction for sequential circuits," *IEEE Trans. Computer-Aided Design*, vol. 11, no. 2, pp. 260–267, February 1992; B. So, "Time-efficient automatic test pattern generation system," Ph.D. Thesis, EE Dept., Univ. of Wisconsin at Madison, 1994; I. Pomeranz and S. M. Reddy, "On static compaction of test sequences for synchronous sequential circuits," *Proc. Design Automation Conf.*, pp. 215–220, June 1996; M. S. Hsiao, E. M. Rudnick, and J. H. Patel, "Fast algorithms for static compaction of sequential circuit test vectors," *Proc. IEEE VLSI Test Symp.*, pp. 188–195, April 1995; S. T. Chakradhar, and M. S. Hsiao, "Partitioning and Reordering Techniques for Static Test Sequence Compaction of Sequential Circuits," *Technical Report* 1997, Computers & Communications Research Lab, NEC USA Inc.

Compaction techniques based on vector restoration are described in I. Pomeranz, and S. M. Reddy, "Vector Restoration Based Static Compaction of Test Sequences for Synchronous Sequential circuits." *Proceedings Int. Conf. on Computer Design*, pp. 360–365, 1997, University of Iowa, August 1997; and A. Raghunathan and S. T. Chakradhar, "Acceleration techniques for dynamic vector compaction," *Proc. Int. Conf. Computer-Aided Design*, pp. 310–317, August 1995.

IB1. Review of vector restoration

A test set is an ordered sequence of vectors $v_1, \ldots, v_n$. The test set detects faults $f_1, \ldots, f_z$ that form the fault set F. If a fault f is detected at vector $v_i$ of the test set, then the detection time D[f] of the fault is i. The information on the detection times can be obtained easily using a pre-processing phase that involves fault simulation. Fault dropping is a conventional way of performing such a fault simulation.

For example, the test set in FIG. 1 has 20 vectors $v_1, \ldots, v_{20}$. This test set detects five faults $f_1, \ldots, f_5$. Fault $f_5$ is detected at vector $v_{20}$. Therefore, $D[f_5]=20$. Detection times for other faults are as shown in the FIG. 1. For any given fault f with D[f]=t, there exists a sequence of vectors $v_i, \ldots, v_t$ ($1 \leq i \leq t$) that detects the fault assuming an unknown initial state. For example, $f_4$ is detected at vector $v_{16}$ and there exists a subsequence $v_1, \ldots, v_{16}$ that detects the fault. It is also possible that a shorter sequence of vectors $v_i, \ldots, v_t$ ($1 < i \leq t$) detects the fault.

A conventional method called linear vector restoration method determines the subsequence by first considering only vector $v_t$. If one or more target faults are not detected, then the subsequence $v_{t-1}, v_t$ is proposed. If this sequence also does not detect all target faults, then additional vectors $v_{t-2}, \ldots, v_1$ (in that order) are considered until all target faults are detected. Such a procedure is clearly complex. More details about the complexity of this technique will be provided below.

The linear vector restoration technique is illustrated by subsequence restoration for faults $f_4$ and $f_5$ which constitute target faults in the example of FIG. 1. Since $f_5$ is detected at $v_{20}$, the first subsequence considered by the linear vector restoration method is $v_{20}$. The fault $f_5$ is not detected by this first subsequence. Therefore, the subsequence is updated to include vector $v_{19}$. The new subsequence is $v_{19}, v_{20}$. This subsequence also does not detect the fault $f_5$. Therefore, additional vectors are restored until the restored subsequence includes $v_{17}$. As shown in FIG. 1, this subsequence detects fault $f_5$. Therefore, vector restoration for fault $f_5$ is complete.

The next step is to verify if $f_4$ is also detected by the restored vector set. For this example, the sequence $v_{17}, \ldots, v_{20}$ also detects $f_4$. This completes the restoration process for the target faults $f_4$ and $f_5$.

IB2. An application of vector restoration

Static compaction method using vector restoration is disclosed in detail in U.S. patent application Ser. No. 09/135, 561, filed on May 27, 1998 by Bommu, et al., now U.S. Pat. No. 5,987,636 which is incorporated herein by reference.

Static compaction methods based on vector restoration share the framework described in FIG. 2. Given a test set, fault set, and detection time for every fault, these methods produce a shorter test set that detects at least as many faults as the original test set. The input data includes a set of test vectors, a list of faults to be detected, and the detection times for the faults, Block 2.01 in FIG. 2. First, a set of faults is chosen as the target faults in Block 2.02. These faults can have the same or different detection times.

If the latest detection time of any fault in the target list is t, then the restoration process Block 2.05 finds a subsequence $v_i, \ldots, v_t$ ($1 \leq i \leq t$) that (1) detects all faults in the target fault list, and (2) if the subsequence is pre-pended to the restored subsequence for earlier target faults, then all earlier target faults are still detected. The next set of target faults is chosen from faults that remain undetected by restored vectors in Block 2.02. This process is continued in Blocks 2.03 and 2.04 until all target faults are detected.

The problem of compacting the test set of FIG. 1 can be used as an illustration of the vector restoration method. Vector restoration for faults $f_4$ and $f_5$ results in the restored sequence $v_{17}, \ldots, v_{20}$. However, fault $f_3$ is still undetected. Therefore, the next target fault chosen is $f_3$. The process continues with restoration for fault $f_3$. The detection time of $f_3$ is 12. Therefore, restoration of $f_3$ starts from the vector $v_{12}$ instead of vector $v_{17}$. The first sequence proposed for $f_3$ is $v_{12}, v_{17}, \ldots, v_{20}$. This is because it is possible that a sequence starting from $v_{12}$ and ending at any of the vectors in the already restored vectors $v_{17}, \ldots, v_{20}$ could detect $f_3$. Therefore, while restoring a vector sequence for $f_3$, the already restored vectors $v_{17}, \ldots, v_{20}$ are also simulated. Restoration process continues until all faults are detected. For this example, the compacted vector set is $v_1, \ldots, v_{12}, v_{17}, \ldots, v_{20}$.

The conventional linear vector restoration techniques have a major problem that limit their usage. They require prohibitively large run-times for systems in large industrial designs.

II. SUMMARY OF THE INVENTION

It is therefore an objective of this invention to provide improved vector restoration techniques that require significantly less run-times than conventional methods.

Specifically it is an object of this invention to provide a method for restoring a minimal subsequence of test vectors for testing a system having a set of faults detectable by the sequence of test vectors.

To achieve the above objects it is provided a method for restoring a sequence of test vectors for testing a system, said system having a set of faults detectable by the sequence of test vectors, a subset of said set of faults called target faults, said method having a validation phase and a restoration phase, wherein said validation phase identifies a first subsequence of test vectors that detects the target faults and a second subsequence that does not detect the target faults, wherein said restoration phase identifies the shortest subsequence in between the first subsequence and the second subsequence that detects the target faults.

Another aspect of this invention is a method for restoring a sequence of test vectors comprising: assigning faults to a fault list; identifying a detection time each for each of said faults; initializing a restoration sequence list to nil; assigning faults from the fault list having highest detection times to a target fault list; assigning base to be equal to minimum of said highest detection times and a time corresponding to a first vector in the restoration sequence list; performing a validation phase that identifies a low subsequence of test vectors that detects all faults in the target fault and a high subsequence that does not detect at least one fault in the target fault list; performing a refinement phase that identifies a shortest subsequence in between the low subsequence and the high subsequence wherein said shortest subsequence detects all faults in the target fault list; removing faults from the fault list that are also in the target fault list; updating the restoration sequence list to be the union of the restoration sequence list and the shortest subsequence identified in step g; and repeating until the fault list is empty.

An improvement includes a method wherein in the validation phase additional vectors are continually added to the restoration sequence and fault simulation is performed until all the faults in the target fault list are detected.

Further improvement includes a method for performing the validation phase.

Still further improvements include a method wherein the refinement phase is performed on the restoration sequence by doing a binary search to detect a shortest subsequence that detects all faults in the target fault list.

Still further improvements include a method for performing the refinement phase.

Another aspect of this invention is a method for restoring a sequence of test vectors in an accelerated manner, said method comprising: identifying test vectors, a fault list having faults that can be detected using said test vectors and detection times for said faults; selecting faults to be assigned to target fault list if said faults exist; performing overlapped validation such that if two faults in the target fault list have restored sequences that overlap then the two faults are merged to form one target fault; performing overlapped refinement if a segment that detects the one target fault exists; and repeating while target faults exist.

Further improvements include a method wherein while performing overlapped validation if restored sequence of two faults have common vectors, restoration process of the two vectors are overlapped.

Still further improvements include a method wherein while at least one fault in the target fault is undetected during overlapped validation step, new target faults that are identified not to be in the target fault list are added to the target fault list.

Still further improvements include a method wherein while performing overlapped refinement a segment is identified between a low sequence that identifies all faults in the target fault list and a high subsequence in which at least one fault in the target fault list is not identified.

Still further improvements include a method wherein while at least one fault in the target fault is undetected during overlapped refinement step if new faults not in the target list are identified then the new faults are added to the target fault list.

Still further improvements include method for performing overlapped validation, overlapped refinement, updating target fault lists and the values of HIGH and LOW.

III. BRIEF DESCRIPTION OF THE DRAWINGS

The above objectives and advantages of the present invention will become more apparent by describing in detail preferred embodiments thereof with reference to the attached drawings in which:

FIG. 4 shows a pseudo-code implementation for an embodiment of the two-phase vector restoration algorithm.

FIG. 7 shows a pseudo-code implementation of an embodiment of an accelerated two-phase vector restoration algorithm.

FIG. 9 shows a pseudo-code implementation of an embodiment of the overlapped validation algorithm.

FIG. 10 shows a pseudo-code implementation of an embodiment of an algorithm that updates range information (LOW and HIGH arrays).

FIG. 11 shows a pseudo-code implementation of an embodiment of an algorithm that updates the target faults list.

FIG. 12 shows pseudo-code for an embodiment of an algorithm that checks the existence of segments.

FIG. 14 shows a pseudo-code implementation of an embodiment of the overlapped refinement algorithm.

FIG. 15 shows an example illustrating accelerated two-phase restoration.

FIG. 16 shows Table 1 with the results for ISCAS circuits.

FIG. 17 shows Table 2 that presents results for several industrial designs using the present invention.

IV. DETAILED DESCRIPTION OF THE INVENTION

This invention provides new techniques for vector restoration. A new, two-step restoration scheme that is shown to be practical for large designs, is disclosed. This method is significantly superior to the conventional linear vector restoration. The techniques described below can be used to improve run-times of applications like static compaction and fault diagnosis.

Experiments demonstrate that using the described restoration technique, a static test sequence compaction can process large industrial designs that could not be handled using conventional linear vector restoration techniques presented in I. Pomeranz, and S. M. Reddy, "Vector Restoration Based Static Compaction of Test Sequences for Synchronous Sequential circuits." *Proceedings Int. Conf. on Computer Design*, pp. 360–365, 1997, University of Iowa, August 1997.

IVA. Two-phase vector restoration

The restoration process of the present invention consists of two phases: validation and refinement. In the validation phase, a sufficient subsequence of vectors is quickly identified. Such a subsequence is guaranteed to also contain a shorter subsequence of vectors that will detect all target faults. This subsequence is larger than necessary and is referred to as the validated segment.

The refinement phase trims the validated segment and finds the shortest subsequence that detects all target faults.

Figure 1:
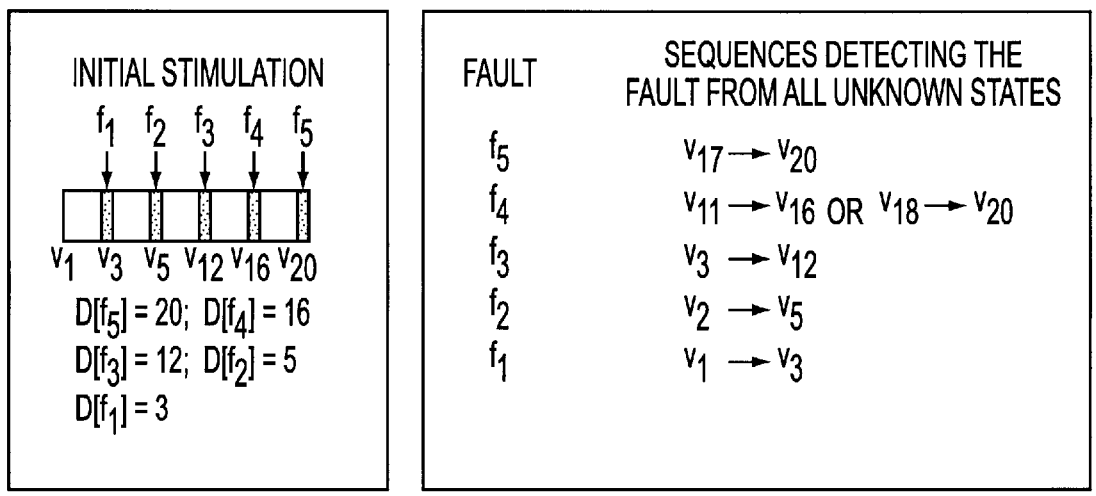
FIG. 1 shows an example depicting a test set and a corresponding fault set.
Figure 2:
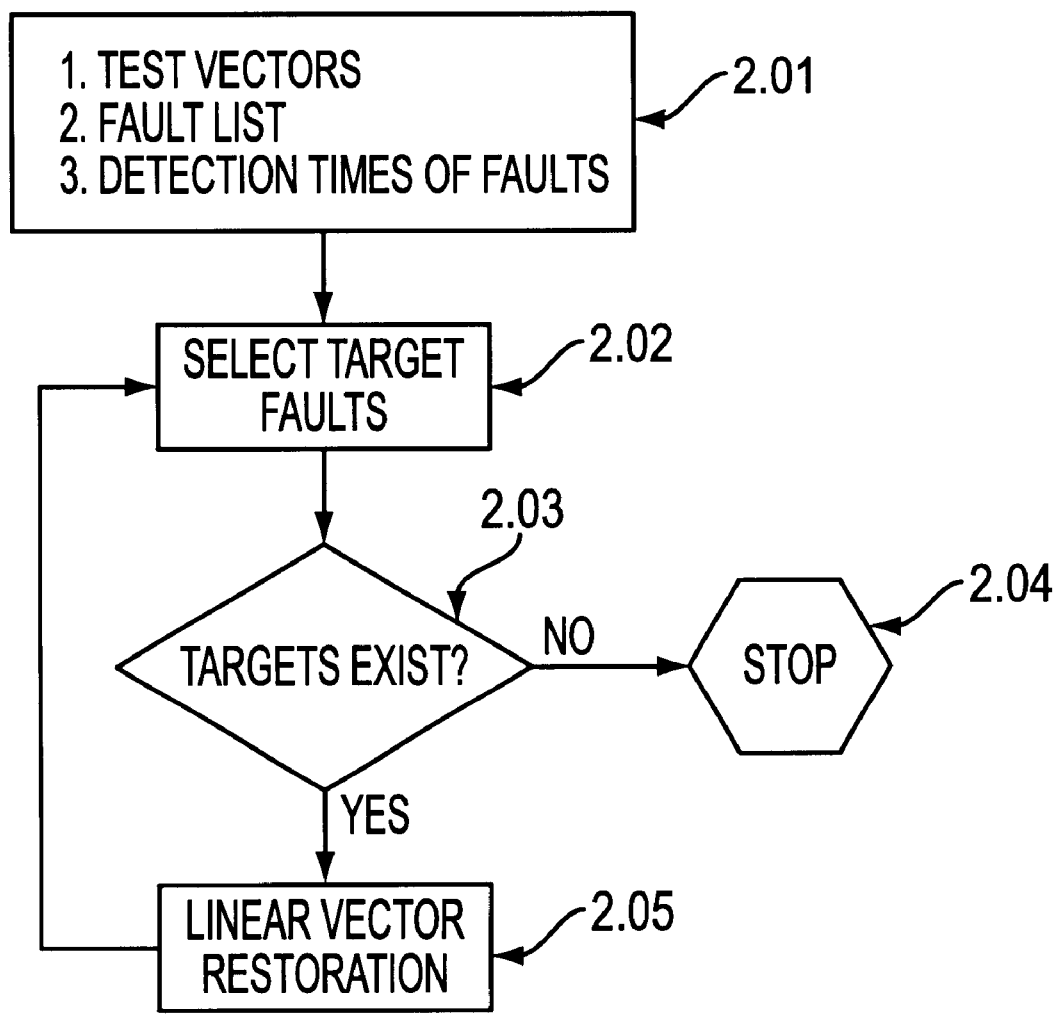
FIG. 2 shows a block diagram illustrating a method for compaction using vector restoration.

The restoration process according to the present invention recognizes that faults can be detected by non-overlapping subsequences. Restoring faults $f_3$ and $f_5$, in the example of FIG. 1, illustrates such a case. The entire test set can be proposed as the subsequence required to detect faults $f_3$ and $f_5$. However, subsequences that detect faults $f_3$ and $f_5$ do not share vectors. As has been shown above, subsequence $v_{17}, \ldots, v_{20}$ detects $f_5$ and subsequence $v_1, \ldots, v_{12}$ detects $f_3$. These subsequences have no vectors in common. The restoration technique of the present invention produces two subsequences instead of a single subsequence. It is clear that these subsequences can be ordered in any way to detect faults $f_3$ and $f_5$. Such independent subsequences are referred to as segments. The restoration technique of the present invention restores non-overlapping segments that can be ordered arbitrarily to detect all target faults.

Figure 3:
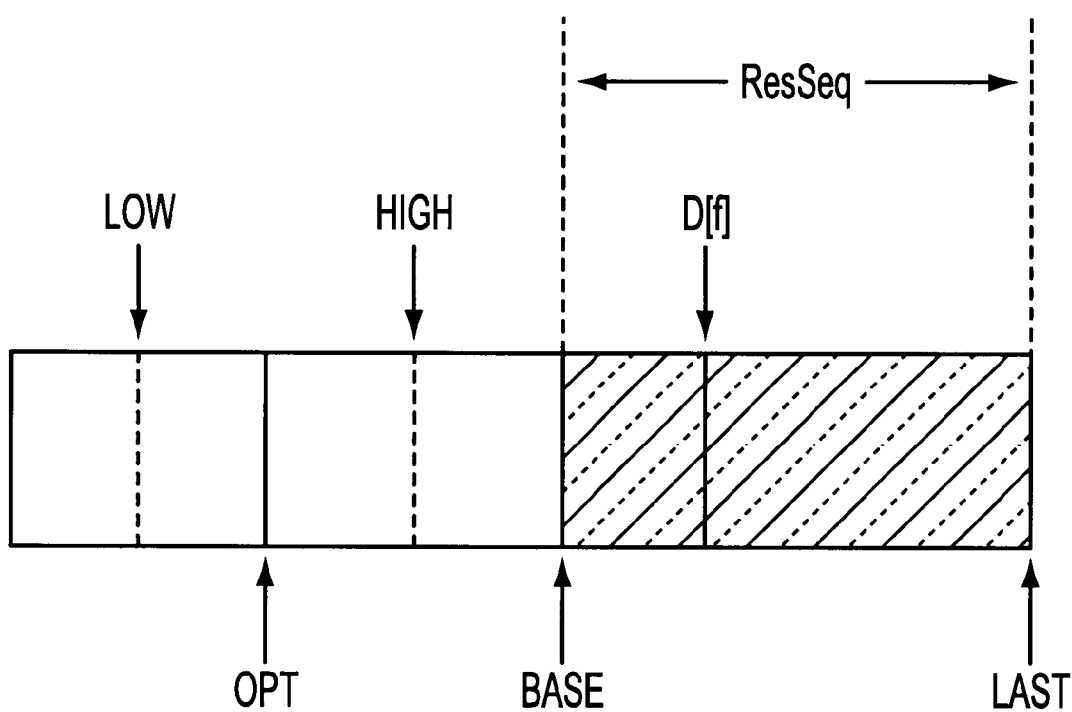
FIG. 3 shows a graphical illustration of an embodiment of the two-phase vector restoration scheme.

A key concept behind the two-phase restoration process can be explained using FIG. 3, which illustrates an embodiment of the two-phase restoration scheme of the present invention. The current target fault is f. Its detection time is shown as D[f]. Labels low, opt, high, base and last assume values between 1 and n (original test set consists of vectors $v_1, \ldots, v_n$). The sequence ResSeg ($v_{base}, \ldots, v_{last}$) restored for earlier targets, and does not detect the current target fault f.

The restoration process for f begins at vector $v_{base}$. Validation phase identifies a subsequence $v_{low}, \ldots, v_{last}$ that detects the target fault. The restoration phase also establishes that subsequence $v_{high}, \ldots, v_{last}$ does not detect the target fault. Importantly, the shortest subsequence that detects the target begins at some vector between $v_{low}$ and $v_{high}$.

The refinement phase identifies the subsequence $v_{opt}, \ldots, v_{base}$ as the shortest subsequence that is added to the restored subsequence ResSeq. Here, low≦opt<high.

An embodiment of the two-phase restoration algorithm is described by the pseudo-code presented in FIG. 4. The restoration algorithm repeats validation and refinement phases until all faults in the input fault list $F_u$ are detected by restored sequence ResSeq. During each iteration, only faults not detected by the currently restored sequence ResSeq are considered. Among the undetected faults, faults that have the highest detection times are selected as target faults. These faults are included in the target fault list $F_T$. Next two sections describe the validation and refinement phases.

IVA1. Validation

Given a target fault list $F_T$, the validation phase determines values of variables low and high that delimit the validated segment. This phase can either inherit a restored sequence ResSeq from previous restoration phases or can begin a new sequence. Variable base is initialized to be the minimum of detection time of a fault in $F_T$ and the index of the first vector in the already restored sequence ResSeg. The restoration algorithm extends ResSeq to detect faults in $F_T$.

The while loop (FIG. 4, Line 6) makes several calls to the fault simulator (FIG. 4, Line 8). If ResSeg has vectors, then fault simulator verifies whether $F_T$ is already detected by ResSeq. If one or more faults in $F_T$ are not detected, then additional vectors are added to ResSeq (FIG. 4, Lines 10 and 11). This process continues until sufficient vectors are added to detect $F_T$.

It can be shown that the validation step makes at most O(log k) calls to the fault simulator, when k vectors are added to ResSeq to detect $F_T$. In the worst case, validation phase simulates only $2^{\lfloor log2k \rfloor+1}$ vectors. This does not include simulation of vectors in ResSeq.

Operation of the validation phase can be illustrated by considering how a sequence for fault $f_5$ in the example of FIG. 1 is restored. Since $f_5$ is the first fault being restored, ResSeq has no vectors. Therefore, base and low are assigned the value D[$f_5$]=20. During the first iteration of the while loop (FIG. 4, Line 6), fault simulator determines that $f_5$ is not detected by the sequence consisting of one vector $v_{20}$. Since $f_5$ is not detected, variable low is updated to be $20-2^0=19$. In the next iteration, the fault simulator determines that $f_5$ is not detected by the sequence $v_{19}, v_{20}$. Therefore, variable high is updated to 19. The variable low is also updated to $20-2^1=18$.

If this process continues, $f_5$ will be detected when low=$20-2^2=16$. This is because the sequence $v_{16}, \ldots, v_{20}$ detects the fault from an unknown initial state. Addition of the vector $v_{16}$ cannot alter detectability of the fault. At this point, high=18. This marks the end of the validation phase. Four iterations of the while loop were required. The validated segment consists of vectors $v_{16}, \ldots, v_{20}$. This segment contains more vectors than necessary to detect $f_5$.

IVA2. Refinement

After the validation phase, all faults in the target fault set $F_T$ are marked as undetected (FIG. 4, Line 13). Refinement phase identifies the shortest subsequence in the validated segment that detects $F_T$.

The while loop (FIG. 4, Line 14) in the refinement phase also makes several calls to the fault simulator (FIG. 4, Line 17). A simple, binary search procedure is used to zoom in on the shortest subsequence that detects all faults in $F_T$. The refinement phase makes at most O(log(high−low)) calls to the fault simulator. If k is the length of the restored sequence, then O(log k) calls to the fault simulator are required in the worst case. Also, the refinement phase in the worst case may require simulation of 2k*log k vectors. This again does not include simulation of vectors in ResSeg.

Refinement phase for $f_5$ (FIG. 1) involves a binary search between low=16 and high=18 for the shortest subsequence that detects $f_5$. The first sequence considered starts at vector $v_{17}$. This is because (low+high)/2=17. Sequence $v_{17}, \ldots, v_{20}$ detects $f_5$. Therefore, low is updated to 17. Since low=high+1, the while loop of Line 14 terminates and the refinement phase also terminates. The shortest subsequence found is $v_{17}, \ldots, v_{20}$.

IVA3. Comparison with linear vector restoration

First, the complexity of the linear vector restoration (LVR) process will be analyzed. In the vector restoration for fault $f_5$, the first sequence considered is of length 1 ($v_{20}$), followed by a sequence of length 2 ($v_{19}, v_{20}$), and this process is continued until the sequence $v_{17}, \ldots, v_{20}$. One vector is added at each iteration. Consequently, total number of vectors simulated during restoration is 1+2+3+4. Here, the length of the restored subsequence is 4 and four steps were involved in retrieving the sequence. Generalizing from the above calculation, if a subsequence of length k is restored, then:

- number of vectors simulated during restoration=1+2+ . . . +k=k(k+1)/2.
- number of iterations to restore the subsequence=k (this also represents the number of times the fault simulator is invoked).

Figure 5:
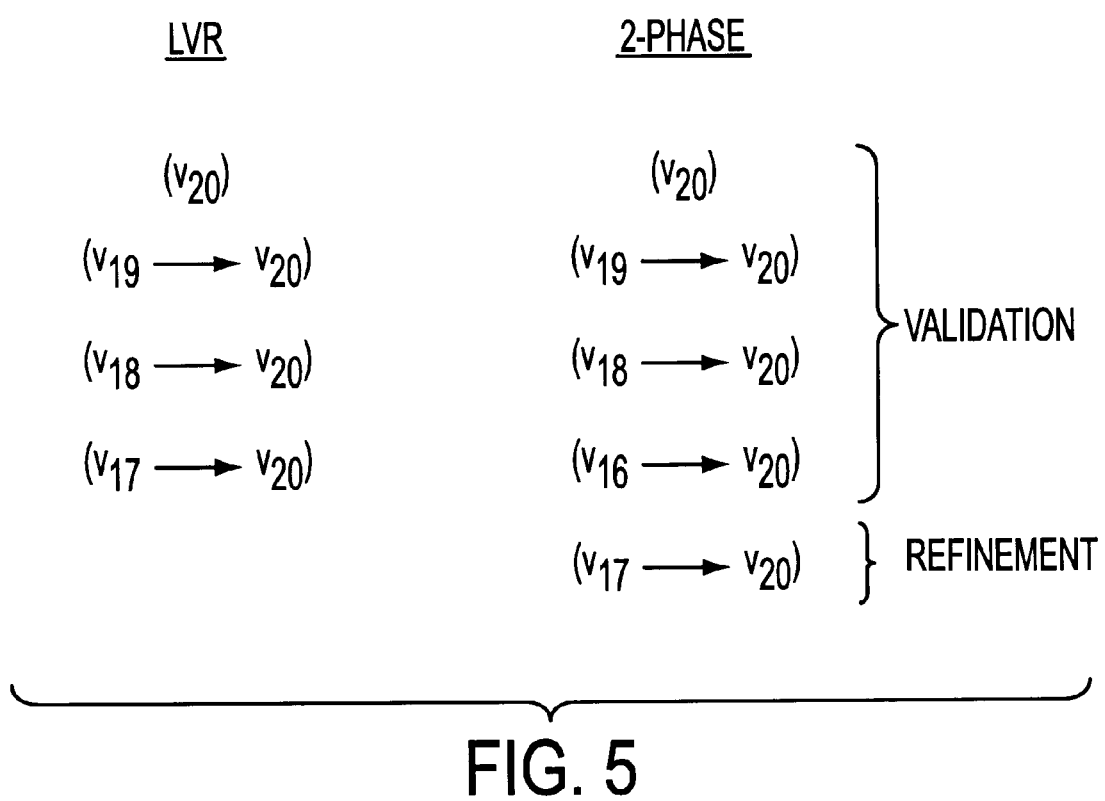
FIG. 5 shows comparison of the conventional linear vector restoration and the two-phase restoration.

FIG. 5 illustrates the different steps involved in LVR and two-phase restoration while restoring the vector for $f_5$ in example of FIG. 1.

The final sequence restored both by LVR and 2φ are exactly the same. If k is the length of restored sequence, then a careful analysis of the algorithm in FIG. 4 shows the following:

- validation phase needs simulation of $2^{[Log2k]+1}$ vectors.
- refinement phase could in the worst case require simulation of $2k*\log_2 k$ vectors.
- algorithm in FIG. 4 makes at most $2\log_2 k+1$ calls to a fault simulator.

The significance of the above analysis is evident when typical numbers for k are considered. When the sequence ResSeq has 1000 vectors and the restoration process for a target requires addition of 100 vectors to ResSeq, the value of k is 100. Vectors from ResSeq are simulated for every call to the fault simulator. If the number of vectors that are simulated during restoration is $v_{LVR}$ for linear restoration and $v_{2\phi}$ for the two-phase technique, then, $v_{LVR}$=1000*(# fault simulator calls)+100*(100+1)/2

=1000*100+5050=105,050

$v_{2\phi}$=1000*(# fault simulator calls)+(256+2* 100*7)

=1000* (2*7+1)+(256+2*100*7)=16, 656

Clearly, two-phase restoration requires almost an order of magnitude fewer simulations as compared to linear restoration. Consequently, significant speed-up is achieved by using two-phase restoration.

IVB. Accelerated two-phase restoration

The two-phase restoration procedure described in FIG. 4 considers a new target only after restoring the shortest sequence for current target. Typically, restored sequences for successive targets overlap. Therefore, it may be unnecessary to find the shortest sequence for current target. In many cases, it is possible to identify the next target even before vector restoration for the current target is complete.

Accelerated two-phase restoration algorithm is another aspect of this invention. In this method, new targets are identified in either the validation phase or the refinement phase. When new targets are identified, the restoration process for the current target is overlapped with the restoration of the new target. As shown below, overlapping of vector restoration in the two-phase method further significantly accelerates the restoration process. The restored segments are identical in both two-phase and accelerated two-phase methods.

Figure 6:
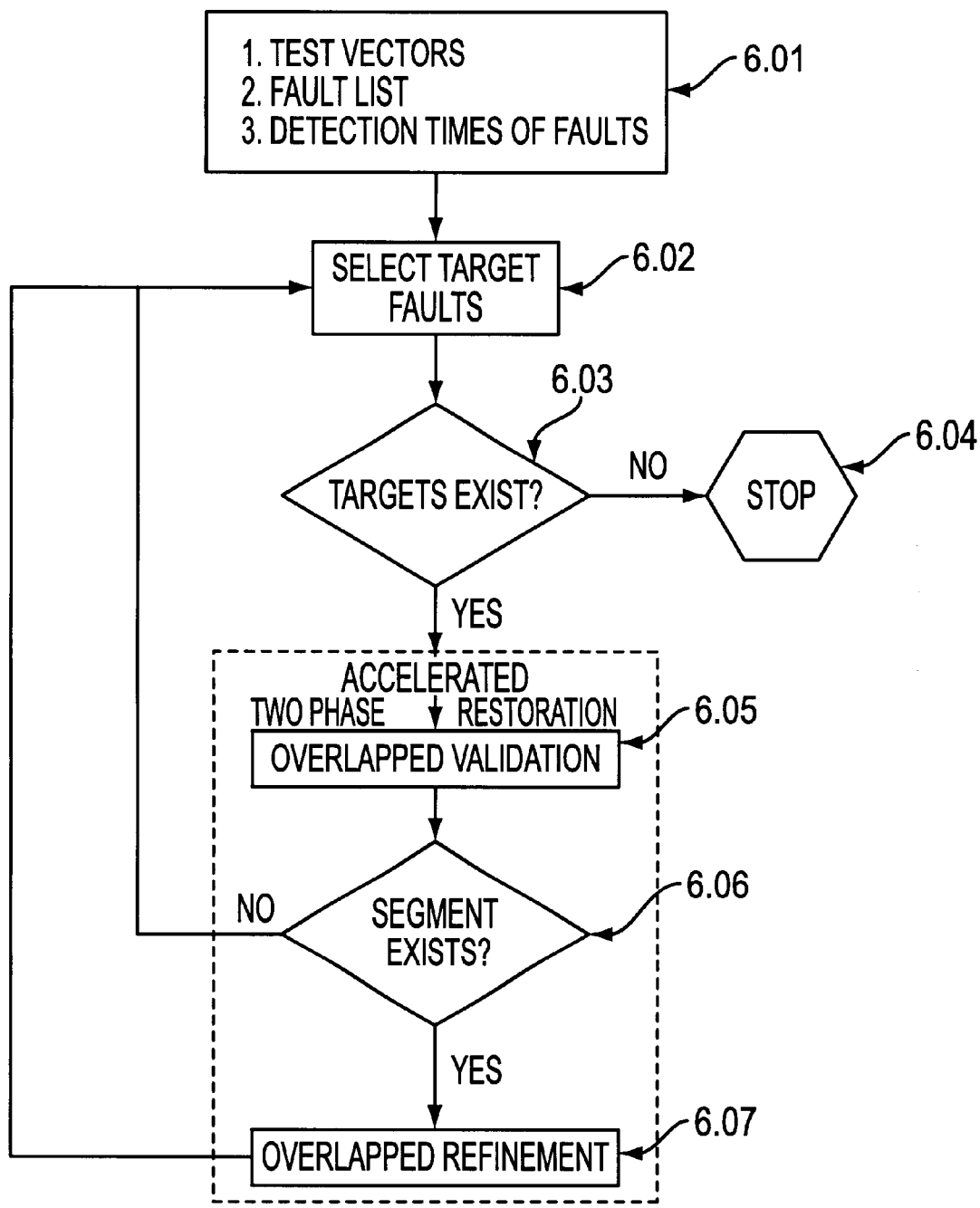
FIG. 6 shows a block diagram illustrating an accelerated two-phase vector restoration scheme.

The accelerated restoration algorithm flow is illustrated in FIG. 6. Like the basic vector restoration algorithm, it inputs a set of test vectors, a list of faults to be detected, and the list of detection times for those faults in 6.01. Unlike the basic two-phase restoration algorithm described above, the accelerated version overlaps validation and refinement of multiple target faults. Specifically, the restoration portion of the accelerated version consists of three phases: overlapped validation 6.05, segment existence condition 6.06, and overlapped refinement phase 6.07.

A key concept behind the accelerated version is as follows. If a subsequence obtained after validation phase does not include a segment for target faults, then a refinement phase is unnecessary. The accelerated version overlaps validation for multiple faults until a subsequence is identified that includes a segment. The refinement phase 6.07 extracts a segment for target faults. Again, this phase overlaps refinement phases of several target faults.

The algorithm for the accelerated version is shown in FIG. 7. Similar to the basic two-phase algorithm, the accelerated version also repeats validation and refinement phases until all faults in the input fault list $F_u$ are detected by the restored sequence ResSeq. The accelerated version also computes the target fault list $F_T$ at the beginning of each iteration. However, there are several fundamental differences between the basic and the accelerated version: (1) accelerated version modifies the target fault list in the validation or refinement phase, (2) accelerated version performs refinement only after the validated phase produces a sequence that includes a segment for target faults, and (3) every refinement phase of the while loop (FIG. 6, Line 8) in the accelerated version produces exactly one segment. This is unlike the basic version where several refinement phases may be required to produce a segment that detects target faults.

The accelerated version also stores more information about the range of vectors that detect or do not detect a fault. This information is easily available during fault simulation of a sequence and target faults. In the algorithm of FIG. 4, the validation phase determines values of variables low and high that satisfy two properties: (1) subsequence $v_{low}, \ldots, v_{last}$ detects all target faults $F_T$, but (2) subsequence $v_{high}, \ldots, v_{last}$ does not detect at least one fault in $F_T$.

The accelerated version uses arrays LOW and HIGH to record the range information for each fault. For a fault f, assuming that LOW[f]=i and HIGH[f]=j, the values i and j always satisfy the following two properties: (1) sequence $v_i, \ldots, v_{last}$ detects the fault, but (2) sequence $v_j, \ldots, v_{last}$ does not detect the fault. Range information for every fault is continuously updated during overlapped validation or refinement. The following two sections describe overlapped validation and refinement.

IVB1. Overlapped validation

In the validation phase of the two-phase restoration algorithm of FIG. 4, assume that $f_x$ is the current target, an intermediate sequence $v_{low}, \ldots v_{last}$ (see FIG. 3) does not detect $f_x$, and that this sequence does not also detect another fault $f_y$ that has a detection time $D[f_y] \geq low$. In such a case, restored sequences for faults $f_x$ and $f_y$ overlap. In particular, both sequences will include vectors $v_{low}, \ldots, v_{D[fy]}$. Therefore, validation for faults $f_x$ and $f_y$ can be overlapped.

In the example of FIG. 1, during validation for $f_3$, the sequence $v_4, \ldots, v_{12}$ is considered as a possible candidate. Fault simulation reveals that both $f_2$ and $f_3$ are not detected. The detection time of $f_2$ is 5. Therefore, any restored sequence that detects $f_2$ will at least share vectors $v_4$ and $v_5$ with the restored sequence for fault $f_3$. Therefore, the restored sequence for $f_3$ alone cannot form a segment. To accelerate segment restoration, both faults can be merged as one target $F_T=(f_2, f_3)$. Validation phase can overlap restoration for faults $f_2$ and $f_3$.

Figure 8:
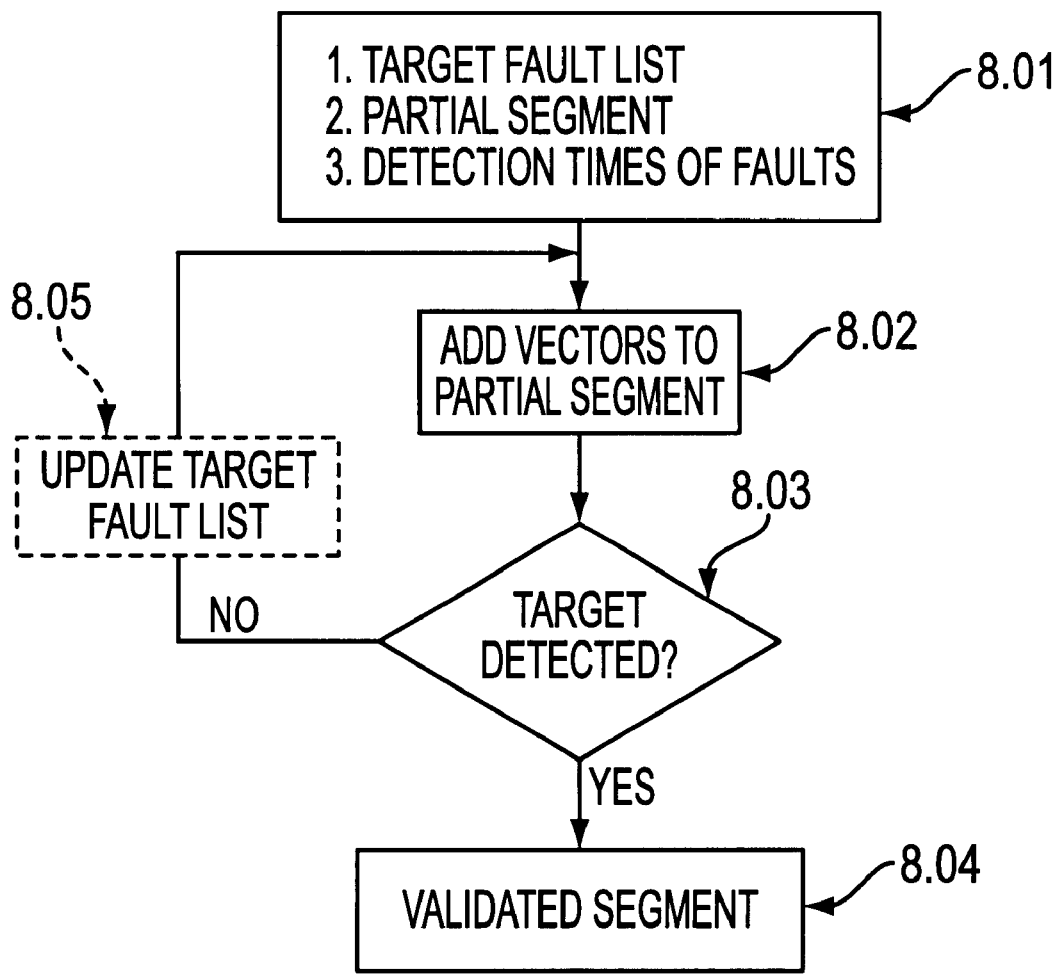
FIG. 8 shows a block diagram illustrating the overlapped validation scheme.

A key concept of the overlapped validation is as follows. If restored sequences of two faults have common vectors, then restoration process for the two faults can be overlapped. This provides a significant computational advantage. The overlapped validation process is shown in FIG. 8. The algorithm inputs a target fault list, partial segment of test vectors, and the detection times of the faults in 8.01. In 8.02 vectors are added to the partial segment. In 8.03 it is determined if the target is detected. If the target is detected, the algorithm exits after outputting the validated segment in 8.04, otherwise the target fault list is updated in 8.05, and the execution continues with 8.02.

If the dotted Block 8.05 that updates the target list in FIG. 8 is ignored, then the flow chart describes the validation phase of the basic algorithm. During overlapped validation, an additional task is performed when one or more faults in the target fault list $F_T$ are not detected. This task determines if new targets have been identified. If a new target is found, then the validation phase proceeds by including new targets in current target fault list.

The detailed algorithm for the overlapped validation phase is shown in FIG. 9. During each iteration of the while loop (FIG. 9, Line 3), a new sequence Seq is proposed (FIG. 9, Line 5). A new fault list $F_s$ is also constructed (FIG. 9, Line 4). This set includes all undetected faults that have detection times corresponding to vectors in Seq. Fault simulation of sequence Seq is used to update the range information for faults in $F_s$. For example, consider a fault $f \epsilon F_s$ that is detected by fault simulation. Let the index of the first vector in Seq be index. If LOW[f]<index, then the value of LOW[f] is updated to be index. This is because fault simulation has established that fault f is detected by the sequence Seq. If fault simulation did not detect fault f, then the value of HIGH[f] can be updated. For example, if HIGH[f]>index, then the value of HIGH[f] is updated to be index. The algorithm for range information update is shown in FIG. 10.

If one or more faults in $F_T$ are not detected by the Seg, then new targets can be identified. This step did not exist in the basic algorithm. New targets are identified using the algorithm UPDATE_TARGETS that is shown in FIG. 11. Using the range information for faults in $F_T$, the index high is first identified in such a way that subsequence $v_{high}, \ldots, v_{last}$ does not detect at least one fault in $F_T$. Undetected faults that are not part of the target fault list $F_T$ (FIG. 11, Line 3) are considered in decreasing order of their detection times. Let fault $f_p$ be such an undetected fault.

Considering the vector $v_{D[fp]}$, if high$\leq D[f_p]+1$, restored sequence for $F_T$ will definitely include the vector $v_{D[fp]}$. Also, if HIGH[$f_p$]$\leq D[f_p]$, then the restored sequence for $f_p$ will also include the vector $v_{D[fp]}$. This is because it is known that the sequence $v_{HIGH[fp]}, \ldots, v_{last}$ cannot detect $f_p$. If vector $v_{D[fp]}$ is common to restored sequences for faults in $F_T$ and the fault $f_p$, the restoration process for these faults can be overlapped by including $f_p$ in $F_T$.

It is possible that $F_T$ includes faults that can be detected by the sequence $v_{high}, \ldots, v_{last}$. For example, consider a fault $f \epsilon F_T$. If LOW[f]$\geq$max, then the sequence $v_{high}, \ldots, v_{last}$ definitely detects f. Line 10 in FIG. 11 identifies such faults. These faults can be marked as detected and they do not have to be considered again during the restoration process. Therefore, they are deleted from the fault list $F_u$ and target list $F_T$. If $f_p$ is included as a new target, then the value of high (FIG. 11, Line 4) is recomputed. The update process stops at the first fault $f_p$, that is not a new target. This is because restored sequences for remaining undetected faults do not overlap with the segment for target faults $F_T$.

IVB2. Segment existence check

The sequence obtained after validation may or may not contain a segment. If no segment exists, then refinement phase is unnecessary. The algorithm in FIG. 12 determines if a sequence includes a segment. The sequence ResSeq does not detect faults in $F_T$. Range information of faults in $F_T$ is used to determine the value of variable low (FIG. 12, Line 2). The sequence Seq=$\{v_{low}, \ldots, v_{base}\}$ U ResSeq detects all faults in $F_T$. This procedure assumes that fault simulation has already been performed for Seq.

SEGMENT_FOUND is an embodiment of an algorithm that determines if subsequence $v_{low}, \ldots v_{base}$ includes a segment that detects $F_T$. In this phase, it is not necessary to identify the exact segment for $F_T$. It suffices to establish existence of a subsequence in Seq that satisfies two properties: (1) subsequence detects $F_T$, and (2) no undetected fault in $F_u$-$F_T$ has a detection time that corresponds to any vector in the subsequence.

The first step is to compute $F_c$. This set includes all undetected faults with detection times corresponding to vectors in Seq. If $F_c$ has no faults, then Seq includes a segment (FIG. 12, Line 6). Otherwise, vectors that belong to restored sequences for faults in $F_c$ have to be excluded. Consider a fault $f \epsilon F_c$. Since HIGH[f]$\leq$low, fault f is not detected by Seq. More importantly, restored sequence for fault f overlaps with Seq. The overlap can include vectors $v_{low}, \ldots, v_{D[f]}$. Therefore, if a segment exists for $F_T$, then it must be contained in the subsequence $v_{D[f]+1}, \ldots, v_{base}$. Line 8 in FIG. 12 determines the index low of the first vector that does not belong to restored sequences for any fault in $F_c$.

Based on faults in $F_c$, a shorter sequence Seq (FIG. 12, Line 9) is proposed. The new sequence Seq may not detect all faults in $F_T$. Fault simulation determines this. If such is the case (FIG. 12, Lines 16–17), Seq does not include a segment for $F_T$. If the Seq does detect all faults in $F_T$ (FIG. 12, Line 14), then it is not clear whether or not a segment for $F_T$ exists. However, now there is a shorter sequence to examine as compared to the original sequence at the beginning of the while loop (FIG. 12, Line 3). The process is repeated for the shorter sequence. This procedure will be illustrated below by using an example.

IVB3. Overlapped refinement

In the example of FIG. 1, after the validation phase of the basic algorithm (FIG. 4) for fault $f_3$, the target fault list $F_T=(f_3, f_2)$, high=4 and low=1. Based on these initial values, the first sequence processed by the fault simulator is $v_2, \ldots, v_{12}$. This sequence detects both faults in $F_T$. However, fault $f_1$ is not detected. Its detection time $D[f_1]=3$ corresponds to vector $v_3$ that is already included in the sequence $v_2, \ldots, v_{12}$. Therefore, the restored sequence for $f_1$ also includes vectors $v_2$ and $v_3$ and further refinement of $v_2, \ldots, v_{12}$ is unnecessary. Refinement phases of fault $f_1$ and faults in $F_T$ should be overlapped to find the segment.

A key concept of overlapped refinement is to find a segment. As in overlapped validation, new targets are identified if one or more faults in $F_T$ are not detected. If a new target is found, then the refinement phase proceeds by including the new target in $F_T$. Unlike the basic algorithm of FIG. 4, the overlapped refinement phase (1) always produces a segment, and (2) new faults may be added to $F_T$ during the refinement phase.

Figure 13:
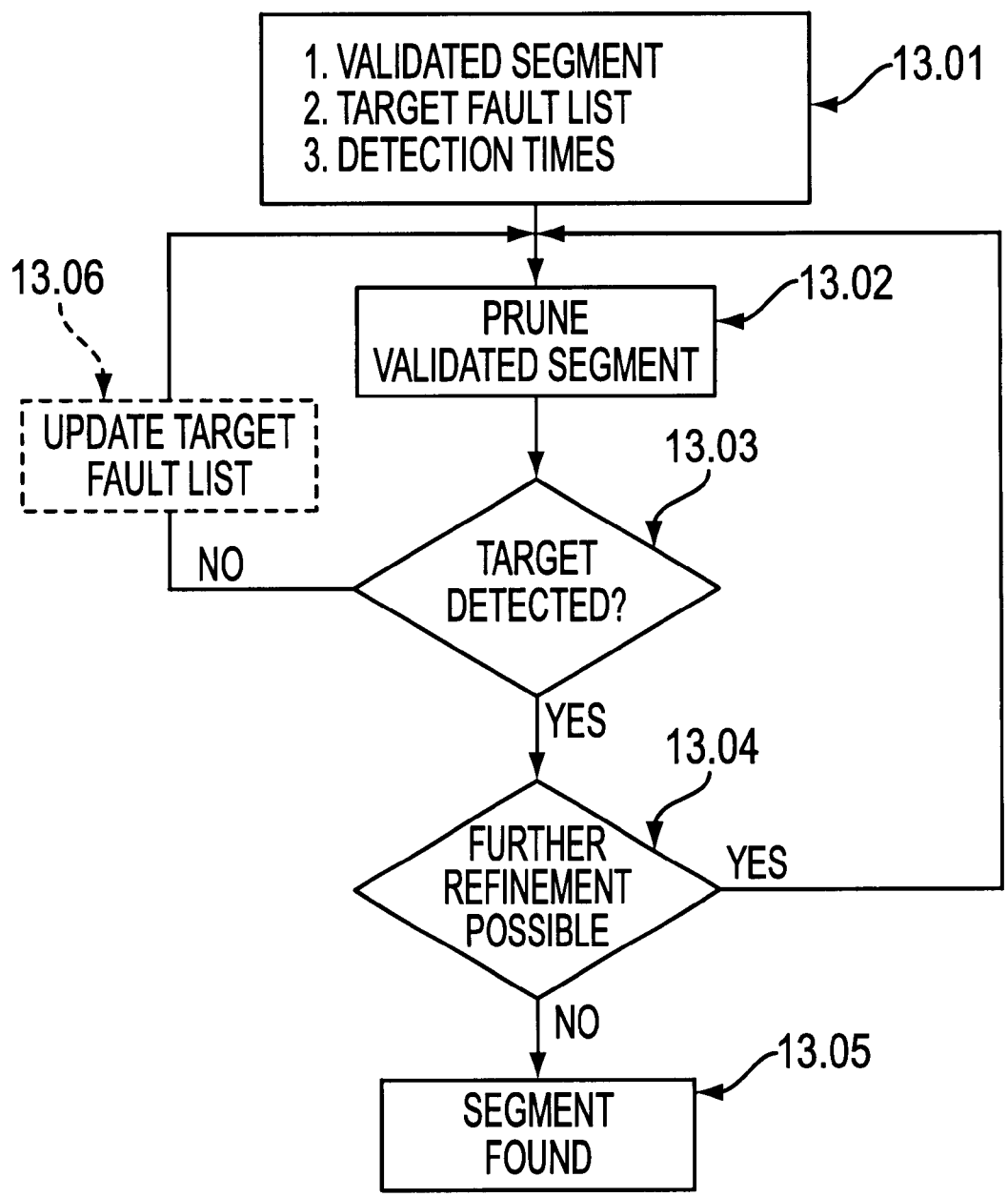
FIG. 13 shows a block diagram illustrating a method for overlapped refinement.

An embodiment of the overlapped refinement process is shown in FIG. 13. The algorithm inputs a validated segment and a list of target faults together with their detection times. The validated segment that is input is pruned in 13.02. In 13.03, the algorithm determines if the target is detected. If the target is not detected, the fault list is updated in 13.06, and the execution resumes with pruning validated segment in 13.02. If the target is detected, condition 13.04 determines if further refinement is possible. If the answer is "yes", the execution continues with pruning validated segment in 13.02, otherwise the execution is completed and the found segment is output.

Again, if the dotted box 13.06 is ignored, then the flow chart shows the refinement phase of the basic algorithm.

An embodiment of a detailed algorithm for the overlapped refinement phase is shown in FIG. 14. Initially, ResSeq does not detect faults in $F_T$. Range information of faults in $F_T$ is again used to find the first vector $v_{low}$ of the sequence that detects faults $F_T$ (FIG. 14, Line 2). All faults in $F_T$ are detected by the subsequence $v_{low}, \ldots, v_{base}$. Range information is also used to identify the index high such that at least one fault in $F_T$ is not detected. This sequence is $v_{high}, \ldots, v_{base}$ A segment for $F_T$ begins somewhere between low and high. Overlapped refinement identifies this segment. This segment detects all faults in $F_T$ but it may also detect other faults. The additional faults detected in the segment eventually become new targets that are included in $F_T$.

During each iteration of the while loop (FIG. 14, Line 4), a new sequence Seq is proposed (FIG. 14, Line 6). A new fault list $F_s$ is constructed that includes undetected faults with detection times corresponding to vectors in Seq. Fault simulation of sequence Seq is used to update the range information for faults in $F_s$.

If all faults in $F_T$ are detected (FIG. 14, Line 11–15), then the next sequence will be chosen using a procedure other than the standard binary search process. Then the set $F_c$ (FIG. 14, Line 11) is computed. This set includes all faults with detection times corresponding to some vector in the sequence Seq but these faults are known not be detectable by sequence Seq. Again, vectors that belong to restored sequences for faults in $F_c$ have to be excluded. Line 12 in FIG. 14 determines the index start of the first vector that does not belong to restored sequences for any fault in $F_c$. The next sequence that will be chosen on Line 6 is $\{v_{start}, \ldots, v_{base}\}$ U ResSeq. Clearly, this is a shorter sequence.

If at least one fault in $F_T$ is not detected, there is an opportunity for finding new targets. UPDATE TARGETS is an embodiment of a procedure that finds new targets. Since new targets may be included in $F_T$, the limits low and high (FIG. 14, Lines 18–19) are recomputed. More importantly, the next sequence will be chosen using the binary search process. A sequence larger than Seq will have to be considered in the next iteration.

Overlapped validation and refinement significantly improves performance in the restoration of a segment. As it will be shown below, these techniques accelerate the compaction process by a factor of 2 for one of the larger industrial designs.

IVB4. EXAMPLE

Example in FIG. 15 will be used to illustrate the operation of the accelerated version of the algorithm. The test set consists of thirty vectors $v_1, \ldots, v_{30}$ and the fault list has eight faults $F_u\{f_1, \ldots, f_8\}$. The example shows detection time and all subsequences that detect a fault assuming an unknown initial state. For example, fault $f_3$ is detected after the application of vector $v_{19}$. Therefore, $D[f_3]=19$. Only subsequence $v_{16}, \ldots, v_{19}$ detects this fault starting from an unknown initial state. Every fault is detected by exactly one subsequence, except fault $f_3$, see FIG. 15. This fault is detected by two subsequences $v_1, \ldots, v_{22}$, and $v_{22}, \ldots, v_{28}$.

For this example, the accelerated version requires two refinement phases. Two segments are found: $\{v_3, \ldots, v_{14}\}$ and $\{v_{17}, \ldots, v_{30}\}$. The procedure used to find the first segment will be illustrated below. The second segment is found in a similar way.

The first segment $v_{17}, \ldots, v_{30}$ is derived as follows. First the 2-φ* algorithm of FIG. 7 will be considered. Since this is the first iteration, there are no vectors in ResSeq. Lines 2–4 are initialization steps that are required before a new segment is derived. Variable base+30 since the highest detection time is for fault $f_5$ and $D[f_8]=30$. The target fault list $F_T$ has only one fault $f_8$. The procedure RESET_LOW_HiGH initializes the arrays LOW and HIGH. For any $f \epsilon F_u$, LOW[f]=1 and HIGH[f]=31.

Algorithm OVERLAPPED_VALIDATION: Initially, $F_T=f_8$. The variable start=31 since HIGH[$f_8$]=31. The restoration process considers seven sequences in the following order:

1. The first sequence considered for fault simulation is $v_{30}$. This is because, from line 4, low=30. The fault set $F_s=\{f_8\}$ because all other faults in $F_T$ have detection times less than 30. Fault simulation of vector $v_{30}$ does not detect any fault in $F_s$. The range information is updated using procedure UPDATE_LOW_HIGH as follows: HIGH[$f_8$]=30. The procedure UPDATE_TARGETS does not produce any new targets. The first fault considered in this procedure is $f_p=f_7$ (FIG. 11, Line 3). The variable high=HIGH[$f_8$]=30. Since $D[f_p]=29$, therefore, high>$D[f_p]$ and fault $f_7$ is not a new target.

2. The next sequence considered for fault simulation is Seq=$\{v_{29}, v_{30}\}$. This is because, from FIG. 9, Line 4, low=29. Set $F_T$ still includes only one fault $f_8$. However, $F_s=\{f_7, f_8\}$ since detection times of both $f_7$ and $f_8$ are equal to or greater than 29. Fault simulation of Seq also does not detect any fault in $F_T$. Range information is updated as follows: HIGH[$f_7$]=HIGH[$f_8$]=29. The procedure UPDATE_TARGETS produces one new target, as follows. The first fault considered in this procedure is $f_p=f_7$. The variable high=HIGH[$f_8$]=29. Since $D[f_7]=29$, therefore, high$\leq D[f_7]+1$. Also, HIGH[$f_7$]$\leq D[f_7]$. Therefore, $f_7$ is a new target and it is included in target fault list $F_T$. The set $F_{det}$ has no faults. The second fault considered is $f_p=f_6$. The variable high=MINIMUM(HIGH[$f_7$],HIGH[$f_8$])=29. Since $D[f_6]=26$, therefore, high>$D[f_6]+1$ and $f_6$ is not a new target.

3. The next sequence considered is Seq=$\{v_{28}, \ldots, v_{30}\}$. For this pass, $F_T=F_s=\{f_7, f_8\}$. Again, fault simulation of Seq does not detect any fault in $F_s$. Range information is updated as follows: HIGH[$f_7$]=HIGH [$f_8$]=28. The procedure UPDATE_TARGETS does not result in a new target.

4. The next sequence considered is Seq=[$v_{26}, \ldots, v_{30}$]. The set $F_T=\{f_7, f_8\}$ and $F_s=\{f_6, f_7, f_8\}$. The fault $f_6$ is considered in $F_8$ because D[$f_6$]=26≧26 and HIGH[$f_6$]=31>26. Fault simulation results in the detection of fault $f_8$. Range information is updated as follows: HIGH [$f_6$]=HIGH[$f_7$]=LOW[$f_8$]=26. The procedure UPDATE_TARGETS (1) produces one new target $f_6$, and (2) the fault $f_8$ is marked detected, and eliminated from both $F_T$ and $F_u$. Fault $f_6$ is a new target because restored sequence for $f_6$ will overlap with the sequence $v_{26}, \ldots, v_{30}$.

5. The next sequence considered is Seq=$\{v_{22}, \ldots, v_{30}\}$. The sets $F_T=\{f_6, f_7\}$ and $F_s=\{f_5, f_6, f_7\}$. Again, fault $f_5$ is included in $F_s$ since its detection time is 22. Fault simulation of Seq results in detection of $f_5$. Range information is updated as follows: HIGH[$f_6$]=HIGH [$f_7$]=LOW[$f_5$]=22. The procedure UPDATE_TARGETS (1) produces no new targets, but (2) the fault $f_5$ is marked detected, and eliminated from both $F_T$ and $F_u$.

6. The next sequence considered is Seq=$\{v_{14}, \ldots, v_{30}\}$. The sets $F_T=\{f_6, f_7\}$ and $F_s=\{f_1, f_2, f_3, f_4, f_6, f_7\}$. Faults $f_1, \ldots, f_4$ are included in $F_s$ since their detection times are greater than or equal to 14. Fault simulation of Seq results in detection of all faults in $F_s$ except $f_1$. Range information is updated as follows: LOW[$f_2$]=LOW [$f_3$]=LOW[$f_4$]=LOW[$f_6$]=LOW[$f_7$]=HIGH[$f_1$]=14. The procedure UPDATE_TARGETS produces no new targets. Since all faults in $F_T$ are detected, the overlapped validation phase terminates with the sequence $v_{14}, \ldots, v_{30}$.

Algorithm SEGMENT_FOUND: Initially, $F_T=\{f_6, f_7\}$ and low=14. Therefore, the sequence $v_{14}, \ldots, v_{30}$ detects all faults in $F_T$. The set $F_c$ is computed as follows. All faults in $F_u=\{f_1, f_2, f_3, f_4, f_6, f_7\}$ have detection times greater than or equal to 14. However, only one fault $f_1$ has HIGH[$f_1$]≦14. Therefore, $F_c=\{f_1\}$. The first sequence proposed for fault simulation is Seq=$\{v_{15}, \ldots v_{30}\}$. The set $F_s=\{f_2, f_3, f_4, f_6, f_7\}$. Fault simulation reveals that all faults in $F_s$ are detected. Range information is updated as follows: LOW[$f_2$]=LOW [$f_3$]=LOW[$f_4$]=LOW[$f_6$]=LOW[$f_7$]=15. Since all faults in $F_T$ are detected, a segment may be possible within the sequence Seq. All faults in $F_T$ are marked as undetected and the shorter sequence $\{v_{15}, \ldots, v_{30}\}$ is examined for a segment. The set $F_c$ is again recomputed and it is found that $F_c$ has no faults. Therefore, the sequence $\{v_{15}, \ldots, v_{30}\}$ has a segment.

Algorithm OVERLAPPED_REFINEMENT: This phase identifies the segment $\{v_{17}, \ldots, v_{30}\}$. At the beginning of the refinement phase, $F_T=\{f_6, f_7\}$. From Lines 1 and 2 of the refinement algorithm in FIG. 14, high=22 and low=15. Therefore, the first vector of the segment is somewhere between vectors $v_{15}$ and $v_{22}$. The refinement process considers five sequences in the following order:

1. The first sequence considered (FIG. 14, line 6) is Seq=$\{v_{18}, \ldots, v_{30}\}$. This is because opt=[(low+high)/2]=18 is determined as in the binary search process of the refinement phase of basic algorithm. The sets $F_T=\{f_6, f_7\}$, and Fs=$\{f_2, f_3, f_4, f_6, f_7\}$. Fault simulation of Seq reveals that faults $f_4$, $f_6$ and $f_7$ are detected. Range information is updated as follows: LOW[$f_4$]= LOW[$f_6$]=LOW[$f_7$]=HIGH[$f_2$]=HIGH[$f_3$]=18. Since all faults in $F_T$ are detected, the set $F_c$ is computed to be $F_c=\{f_2, f_3\}$. Since $F_c$ has faults, therefore, the next sequence is not chosen using the standard binary search process. The variable start=1+19=20, and variable low=18.

2. The next sequence considered is Seq=$\{v_{20}, \ldots, v_{30}\}$. This is because, from FIG. 14, Line 5, opt=start=20. At this time $F_T$ is unchanged, and $F_s=\{f_4, f_6, f_7\}$. Fault simulation of Seq reveals that faults $f_6$ and $f_7$ are detected but $f_4$ is not detected. Range information is updated as follows: LOW[$f_6$]=LOW[$f_7$]=HIGH[$f_4$]=20. Since all faults in $F_T$ are detected, the set $F_c$ is computed to be $F_c=\{f_4\}$. Since $F_c$ has faults, therefore, the next sequence is not chosen using the standard binary search process. The variable start=1+21=22, and variable low=20.

3. The next sequence considered (FIG. 14, Line 6) is Seq=$\{v_{22}, \ldots, v_{30}\}$. Again, $F_T=\{f_6, f_7\}$ remains unchanged. however, $F_s=\{\ \}$. This is because Seq has already been considered for fault simulation during the OVERLAPPED_VALIDATION phase. Therefore, no fault simulation is necessary. Faults $f_6$ and $f_7$ cannot be detected by Seq. Range information remains unchanged: HIGH[$f_6$]=HIGH[$f_7$]=22. Now, new targets are identified by using procedure UPDATE_TARGETS.

Algorithm UPDATE_TARGETS of FIG. 11 is executed next. Initially, $F_T=\{f_6, f_7\}$ and $F_u=\{f_1, f_2, f_3, f_4, f_6, f_7\}$.

(a) The first fault considered (FIG. 11, Line 3) is $f_p=f_4$. Considering all faults in $F_T$, it is determined that high=22 (FIG. 11, Line 4). Since high≦D[$f_4$]+1 and HIGH[$f_4$]=20≦D[$f_4$], there is a new target $f_4$ that is included in $F_T$. The set $F_{det}$ is computed to be $F_{det}=\{\ \}$ (Line 10) This is because LOW[$f_6$] and LOW[$f_7$] is equal to 20 and high=22.

(b) The second fault considered is $f_p=f_3$. Since D[$f_3$]=19 and high=20, fault $f_3$ is a new target. Again, $f_3$ is added to $F_T$. The target fault list is updated to $F_T=\{f_3, f_4\}$. The set $F_{det}$ is computed to be $F_{det}=\{f_6, f_7\}$. This is because LOW[$f_6$]=LOW[$f_7$]=20≧high. These two faults are marked detected. They are deleted from $F_T$ and $F_u$. Now, $F_T=\{f_3, f_4\}$.

(c) The third fault considered is $f_p=f_2$. Since D[$f_2$]=18 and high=18, fault $f_2$ is a new target. Again, $f_2$ is added to $F_T$. The target fault list is updated to $F_T=\{f_2, f_3\}$. Set $F_{det}$ is found to be $F_{det}=\{f_4\}$. Fault $f_4$ is marked as detected. This fault is deleted from $F_T$ and $F_u$. Now, $F_T=\{f_2, f_3\}$.

(d) The last fault considered is $f_p=f_1$. Since D[$f_1$]=14 and high=18, fault $f_1$ is not a new target. No more new targets are possible.

4. Then the execution switches back to Line 18 of the OVERLAPPED_REFINEMENT algorithm (FIG. 14). At this point, $F_T=\{f_2, f_3\}$. Since $F_T$ has changed, the limits are recomputed to be high=18 and low=15. Note that the next sequence will be chosen using the binary search process. The next sequence considered is Seg=$\{v_{16}, \ldots, v_{30}\}$. This is because from FIG. 14, Line 5, opt=16. The set $F_s$ is the same as $F_T$. Fault simulation of Seq reveals that both faults $f_2$ and $f_3$ are detected. Range information is updated as follows: LOW[$f_2$]=LOW[$f_3$]=16. Since all faults in $F_T$ are detected, it is possible that the segment for $F_T$ may be shorter than Seq. The next sequence will not be chosen using the binary search process. The variable start=1+16=17, and variable low=16.

5. The last sequence considered is Seq=$\{v_{17}, \ldots, v_{30}\}$. This is because from Line 6 of FIG. 14, opt=17. Now, $F_s = F_I = \{f_2, f_3\}$. Fault simulation of Seq reveals that $f_2$ is detected but $f_3$ is not. Range information is updated as follows: LOW[$f_2$]=HIGH[$f_3$]=17. There is an opportunity for finding a new target. Procedure UPDATE_TARGETs (1) does not find any new target, but (2) it determines that $f_2$ is detected. This fault is deleted from $F_T$ and $F_u$. The values of high and low are recomputed to be 17 and 16, respectively. This violates the condition of the while loop (FIG. 14, Line 4) and the refinement process is terminated.

IVC. Experimental Results

The described vector restoration technique was implemented as part of a static test sequence compaction system. The implementation includes both basic and advanced techniques described above. To make a fair comparison, the linear vector restoration algorithm was also implemented. Standard approach performs simulation on a single fault during the vector restoration process. I. Pomeranz, and S. M. Reddy, "Vector Restoration Based Static Compaction of Test Sequences for Synchronous Sequential circuits." *Proceedings Int. Conf. on Computer Design* pp. 360–365, 1997, University of Iowa, August 1997. This approach was augmented to consider multiple faults during vector restoration. In the present implementation, faults with the same detection time are considered simultaneously for restoration. Thus, the procedure takes advantage of the parallel fault simulator used in the implementation. Present implementation of the linear vector restoration algorithm will be referred to as LVR*.

Experimental results are reported for ISCAS benchmark circuits and several industrial designs. F. Brglez, D. Bryan, and K. Kozminski, "Combinational profiles of sequential benchmark circuits," *Int. Symposium on Circuits and Systems*, pp. 1929–1934, May 1989. New techniques will be compared with the LVR* approach. Table 1 shown in FIG. 16 presents results for ISCAS circuits. Table 2 shown in FIG. 17 presents results for several industrial designs. All tables report number of vectors in the original and compact vector set. Compaction quality is reported as percentage reduction in the original vector test. The CPU seconds are reported for Sun UltraSPARC work station. CPU seconds reported are platform-specific. Therefore, to give an idea of the complexity of the algorithm, the time taken for fault simulation of all faults using original vector set is also reported. These times are reported under column Initial Sim. Time. Columns LVR*, 2-$\phi$, and 2-$\phi$* report CPU seconds required for compaction using linear vector restoration, two-phase restoration and accelerated two-phase restoration, respectively. Vector restoration based compaction approaches preserve the fault coverage of the original vector set. Therefore, fault coverage numbers are not reported.

The initial vector set used for ISCAS circuits were obtained using the test set generator HITEC described in T. M. Niermann and J. H. Patel, "HITEC: A test generation package for sequential circuits," *Proc. European Conf. Design Automation* (EDAC), pp. 214–218, March 1991. The results for compaction on ISCAS circuits are given in Table 1. The compaction with proposed restoration techniques is significantly faster for larger ISCAS designs. For ISCAS designs, on the average, compaction using described technique is about twice the time taken for one fault simulation of original vector set.

The number of gates and number of flip flops in industrial designs considered in the experiments are given in Table 2. Industrial designs have several non-Boolean primitives, such as tristate buffers, bidirectional buffers and buses. In addition, they have set/reset flip-flops and multiple clocks.

Original test sets for these circuits were derived using a commercial test generator. Table 2 also shows results obtained by using the acceleration techniques described above. Results using the basic algorithm of FIG. 4 are reported in column 2-$\phi$. Results obtained using the acceleration techniques discussed above are reported in column 2-$\phi$*. In general, we find that the compaction time is about 2 to 10 times the initial fault simulation time. Compaction with accelerated two-phase restoration runs 2 to 5 times faster than linear vector restoration. For example for industrial design p29, compaction with accelerated two-phase restoration was completed in 12380 seconds. For the same circuit, compaction with improved linear vector restoration required 41616 seconds. Using the proposed restoration technique, the compaction system was able to complete on large designs containing about 200,000 gates and 5000 flip flops, while LVR* did not complete even after 2 CPU days. The overlapped validation and refinement algorithms have proven to be extremely useful for large designs. Results for these techniques are reported in column 2-$\phi$*. The 2-$\phi$* version is particularly effective for circuits with large segments. For example, in industrial design p306 there is a segment of 2666 vectors and the use of 2-$\phi$* algorithm results in more than a factor of 2 improvement in CPU seconds.

The experimental results demonstrate the superiority of the new vector restoration technique. Described technique significantly improves the run times of vector restoration based static compaction algorithms.

IVD. Conclusion

The vector restoration technique described above is significantly superior to existing techniques. The new technique performs vector restoration by repeatedly iterating over two phases: validation and refinement. The described technique can restore subsequences that satisfy additional conditions such as: (1) target faults are detected assuming a known initial state before application of the subsequence, or (2) restored subsequence forms a segment. Subsequences that satisfy additional properties are useful in static test sequence compaction and fault diagnosis methods. Several acceleration techniques for vector restoration are also disclosed. Results from experiments on ISCAS designs and several large industrial designs confirm the practicality of presented approach.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for restoring a sequence of test vectors for testing a system, said system having a set of faults detectable by the sequence of test vectors, a subset of said set of faults called target faults, said method having a validation phase and a restoration phase, wherein said validation phase identifies a first subsequence of test vectors that detects the target faults and a second subsequence that does not detect the target faults, wherein said restoration phase identifies the shortest subsequence in between the first subsequence and the second subsequence that detects the target faults.

2. A method for restoring a sequence of test vectors comprising:

a) assigning faults to a fault list;

b) identifying a detection time each for each of said faults;
c) initializing a restoration sequence list to nil;
d) assigning faults from the fault list having highest detection times to a target fault list;
e) assigning base to be equal to minimum of said highest detection times and a time corresponding to a first vector in the restoration sequence list;
f) performing a validation phase that identifies a low subsequence of test vectors that detects all faults in the target fault and a high subsequence that does not detect at least one fault in the target fault list;
g) performing a refinement phase that identifies a shortest subsequence in between the low subsequence and the high subsequence wherein said shortest subsequence detects all faults in the target fault list;
h) removing faults from the fault list that are also in the target fault list;
i) updating the restoration sequence list to be the union of the restoration sequence list and the shortest subsequence identified in step g; and
j) repeating steps d-i until the fault list is empty.

3. The method of claim 2 wherein in the validation phase additional vectors are continually added to the restoration sequence and fault simulation is performed until all the faults in the target fault list are detected.

4. The method of claim 2 wherein the validation phase of step f comprises:
(f)(1) assigning low=base;
(f)(2) creating a sequence list that is a union of a vector sequence low to base and the restoration sequence;
(f)(3) running simulation to simulate faults in the target fault list using the sequence list of (f)(2);
(f)(4) setting high=low, low base K, wherein K is a predetermined value; and
(f)(5) repeating step (f)(2)–(f)(4) until all faults in the target fault list are detected.

5. The method of claim 2 wherein the refinement phase is performed on the restoration sequence by doing a binary search to detect a shortest subsequence that detects all faults in the target fault list.

6. The method of claim 2 wherein the refinement phase of step g comprises:
(g)(1) assigning opt equal to a midpoint of high and low;
(g)(2) creating a sequence list that is a union of a vector sequence from opt to base and the restoration sequence;
(g)(3) simulating faults in the target fault using the sequence list of (g)(2);
(g)(4) assigning low=opt if all faults in the target fault list are detected and high=opt if all faults in the target fault are not detected; and
(g)(5) repeating steps (g)(1)–(g)(4) while low<high–1.

7. The method of claim 4 wherein K=$x^i$, x>=2 and i=0 in the first repetition and i is incremented by a constant value in repetitions other than the first repetition.

8. A method for restoring a sequence of test vectors in an accelerated manner, said method comprising:
(a) identifying test vectors, a fault list having faults that can be detected using said test vectors and detection times for said faults;
(b) selecting faults to be assigned to target fault list if said faults exist;
(d) performing overlapped validation such that if two faults in the target fault list have restored sequences that overlap then the two faults are merged to form one target fault;
(e) performing overlapped refinement if a segment that detects the one target fault exists in step d; and
(f) repeating steps (b)–(e) while target faults exist in step (b).

9. The method of claim 8 wherein while performing overlapped validation if restored sequence of two faults have common vectors, restoration process of the two vectors are overlapped.

10. The method of claim 8 wherein while at least one fault in the target fault is undetected during overlapped validation step, new target faults that are identified not to be in the target fault list are added to the target fault list.

11. The method of claim 8 wherein while performing overlapped refinement a segment is identified between a low sequence that identifies all faults in the target fault list and a high subsequence in which at least one fault in the target fault list is not identified.

12. The method of claim 8 wherein while at least one fault in the target fault is undetected during overlapped refinement step if new faults not in the target list are identified then the new faults are added to the target fault list.

13. The method of claim 8 wherein step d comprises:
(d)(1) assigning HIGH(f) and LOW(f) for each fault in the fault list wherein a subsequence from HIGH(f) to a last vector does not detect fault f and a subsequence from LOW(f) to the last vector detects the fault;
(d)(2) setting low=0;
(d)(3) setting start to be equal to the minimum of HIGH(f) of all the faults f;
(d)(4) setting low to be equal to the maximum of start—L and low, wherein L is a predetermined value;
(d)(6) setting sequence to be equal to the union of a subsequence from low to base and the restoration sequence;
(d)(7) selecting faults to be in a second fault list $F^s$ such that D[f]>=low and HIGH [f]>low for all faults in the faults list;
(d)(8) running simulation to check if faults in $F^s$ are detected by the sequence of step (d)(6);
(d)(9) updating target faults list;
(d)(10) updating HIGH and LOW; and
(d)(11) repeating steps d(4)–(d)(8) while faults in the target fault list are not detected.

14. The method of claim 8 wherein step e comprises:
(e)(1) assigning high to be the minimum of HIGH[f] for all faults f;
(e)(2) assigning low to be the minimum of LOW[f] for all faults f and binary-search to be Yes;
(e)(3) setting opt=(low+high)/2 if binary_search is Yes and opt=start if binary_search is no;
(e)(4) creating a sequence list that is a union of a vector sequence from opt to base and the restoration sequence;
(e) (5) assigning faults to a second fault list $F^s$ such that D[f]>=opt and HIGH [f]>opt for all faults in the faults list;
(e)(6) running a simulation to see if faults in $F^s$ are detected using the sequence list;
(e)(7) updating LOW and HIGH for faults in $F^s$;
(e)(8) performing the following steps if faults in the target fault list are detected:
(e)(8) (i) computing fault list $F_c$ that includes all faults that are not detectable by the sequence and with detection times corresponding to a in the sequence list;

(e)(8) (ii) setting start=maximum D[f]+1 for all faults in $F_c$;
(e)(8) (iii) setting low to be equal to opt; and
(e)(8)(iv) binary-search=Yes if Fc is nil binary-search=No if Fc is not nil;
(e)(9) performing the following steps if faults in the target fault list are not detected:
(e)(9)(i) updating target fault list;
(e)(9)(ii) setting high to maximum of HIGH[f] for faults in the target fault list;
(e) (9) (iii) setting low to maximum of LOW[f] for faults in the target list; and
(e)(9)(iv) setting binary-search=Yes; and
(e)(10) repeating (e)(3)–(e)(9) while low<high−1.

15. The method of claim 13 wherein step (d) (10) comprises:
(d) (10) (i) setting LOW(f) to be equal to maximum of LOW(f) and low if fault f is detected;
(d)(10)(ii) setting HIGH(f) to be equal to minimum of HIGH(f) and low if fault f is not detected; and
(d) (10) (iii) repeating steps (d)(10)(i)–(d)(10)(ii) for all faults.

16. The method of claim 13 wherein step (d)(9) comprises:
(d)(9)(i) selecting a fault $f^p$ with the highest D[f] that is yet undetected and that is not on the target fault list;
(d)(9)(ii) setting high to be equal to the minimum HIGH [f] for all faults in the target faults list;
(d)(9)(ii) adding $f^p$ to the target fault list if high<=D $[f^p]$+1 and HIGH $[f^p]$<=D$[f^p]$;
(d)(9)(iv) selecting faults f from the target fault list with LOW[f]>=high and removing them from the target fault list and from the undetected fault list; and
(d)(9)(v) repeating steps (d)(9)(i)–(d)(9)(iv) while $f^p$ is added to the target fault list.

* * * * *